United States Patent
Spencer

(10) Patent No.: US 7,523,375 B2
(45) Date of Patent: Apr. 21, 2009

(54) SET OF IRREGULAR LDPC CODES WITH RANDOM STRUCTURE AND LOW ENCODING COMPLEXITY

(75) Inventor: Quentin Spencer, St. Louis, MO (US)

(73) Assignee: Distribution Control Systems, St. Louis, MO (US)

(*) Notice: Subject to any disclaimer, the term of this patent is extended or adjusted under 35 U.S.C. 154(b) by 184 days.

(21) Appl. No.: 11/232,072

(22) Filed: Sep. 21, 2005

(65) Prior Publication Data

US 2007/0067694 A1    Mar. 22, 2007

(51) Int. Cl.
*H03M 13/00* (2006.01)

(52) U.S. Cl. .................... 714/752; 714/800; 714/804

(58) Field of Classification Search ............. 714/752, 714/799, 801, 800, 763, 804, 805; 341/59
See application file for complete search history.

(56) References Cited

U.S. PATENT DOCUMENTS

| | | | |
|---|---|---|---|
| 6,895,547 B2 * | 5/2005 | Eleftheriou et al. ......... | 714/801 |
| 6,933,865 B1 * | 8/2005 | Kuznetsov et al. ........... | 341/59 |
| 7,191,378 B2 | 3/2007 | Eroz | |

OTHER PUBLICATIONS

S. J. Johnson and S.R. Weller, "A Family of Irregular LDPC Codes with Low Encoding Complexity," *IEEE Communications Letters*, vol. 7, pp. 79-81, Feb. 2003.

R. Gallager, "Low-Density Parity-Check Codes," *IEEE Transactions on Information Theory*, vol. 8, pp. 21-28, Jan. 1962.

D.J.C. MacKay, "Good Error-Correcting Codes Based on Very Sparse Matrices," *IEEE Transactions on Information Theory*, vol. 45, pp. 399-431, Mar. 1999.

S.J. Johnson and S.R. Weller, "Resolvable 2-Designs for Regular Low-Density Parity-Check Codes," *IEEE Transactions on Communications*, vol. 51, pp. 1413-1419, Sep. 2003.

S.J. Johnson and S.R. Weller, "Codes for Iterative Decoding From Partial Geometries," *IEEE Transactions on Communications*, vol. 52, pp. 236-243, Feb. 2004.

S. Lin, L. Chen, J. Xu, and I. Djurdjevic, "Near Shannon limit Quasi-Cyclic Low-Density Parity-Check Codes," in *Proceedings of the IEEE Global Telecommunications Conference (GLOBECOM)*, vol. 4, pp. 2030-2035, Dec. 1-5, 2003.

(Continued)

*Primary Examiner*—Esaw T Abraham
*Assistant Examiner*—Fritz Alphonse
(74) *Attorney, Agent, or Firm*—Polster, Lieder, Woodruff & Lucchesi, L.C.

(57) ABSTRACT

A set of irregular LDPC (Low Density Parity Check) codes having a pseudo-random structure and low encoding complexity. A block-cyclic LDPC code has an irregular row or an irregular column weight and includes a parity check matrix and an encoding matrix each of which has a pseudo-random structure. This allows the code to have the irregular row weight or irregular column weight together with an overall randomness to the code structure. Blocks within the code can be shortened, adjacent blocks of code can be overlapped, and adjacent columns within a block can be arbitrarily permuted so to change the weighting of rows and columns. The LDPC codes are particularly useful in two-way communications system for an electrical distribution system (1) to restore data lost or corrupted during its transmission.

23 Claims, 3 Drawing Sheets

OTHER PUBLICATIONS

B. Vasic and O. Milenkovic, Combinatorial Constructions of Low-Density Parity Check Codes for Iterative Decoding, *IEEE Transactions on Information Theory*, vol. 50, pp. 1156-1176, Jun. 2004.

H. Tang, J. Xu, S. Lin, and K.A.S. Abdel-Ghaffar, "Codes on Finite Geometries," *IEEE Transactions on Information Theory*, vol. 51, pp. 572-596, Feb. 2005.

J.W. Bond, S. Hui, and H. Schmidt, "Constructing Low-Density Parity-Check Codes with Circulant Matrices," in *Proceeding of the Information Theory and Networking Workshop*, (Metsovo, Greece), p. 52, IEEE, Jun. 27-Jul. 1, 1999.

D.E. Hocevar, "Efficient Encoding for a Family of Quasi-cyclic LDPC Codes," in *Proceedings of the IEEE Global Telecommunications Conference (GLOBECOM)*, vol. 7, pp. 3996-4000, IEEE, Dec. 1-5, 2003.

\* cited by examiner

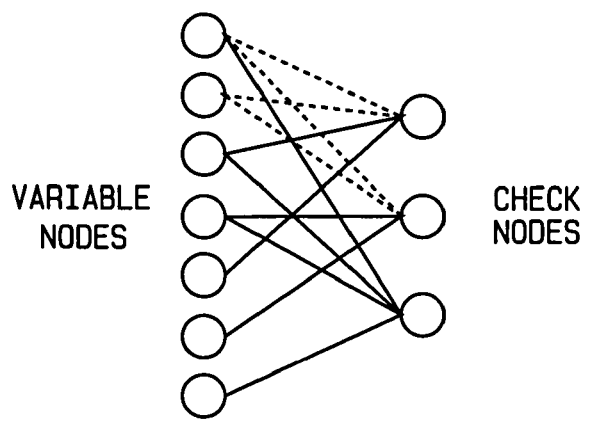
FIG. 4
FIG. 5
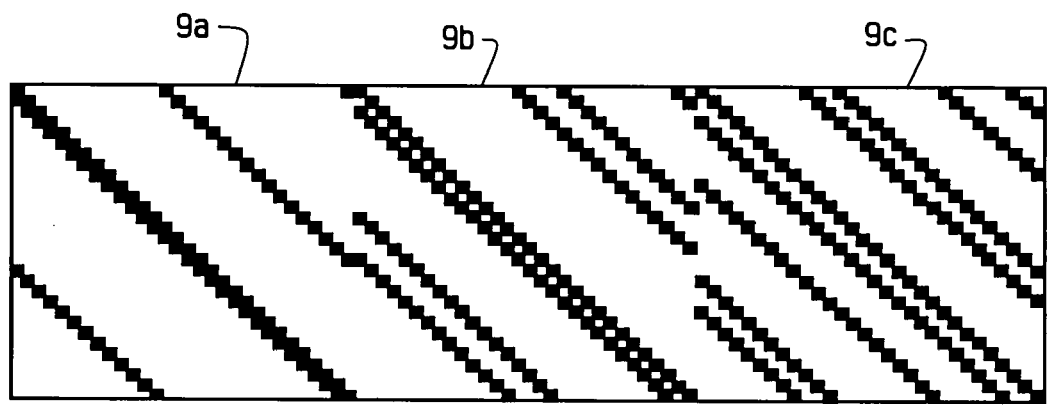
FIG. 6
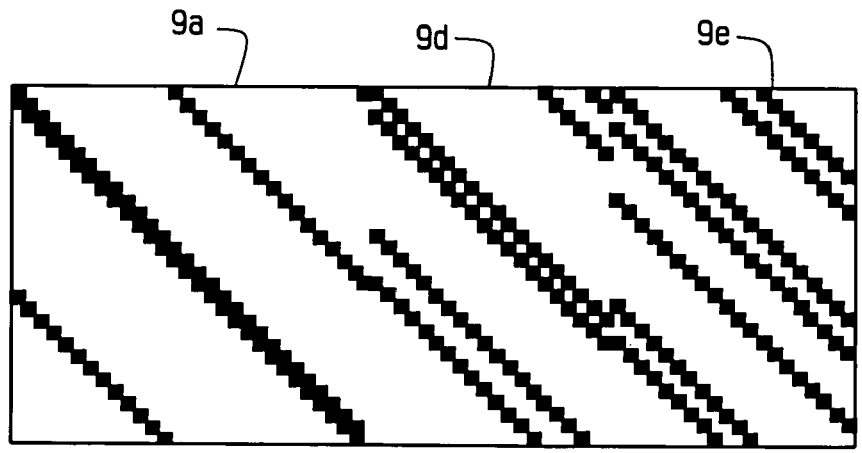
FIG. 7

SET OF IRREGULAR LDPC CODES WITH RANDOM STRUCTURE AND LOW ENCODING COMPLEXITY

CROSS REFERENCE TO RELATED APPLICATIONS

None

STATEMENT REGARDING FEDERALLY SPONSORED RESEARCH OR DEVELOPMENT

N/A

BACKGROUND OF THE INVENTION

This invention relates to the class of error-correcting codes known as Low-Density Parity-Check (LDPC) codes, and more particularly to a set of such codes whose parity-check matrices have irregular column or irregular row weighting, or both, and have a pseudo-random structure. The use of such codes has particular advantages for a two-way communications system employed in an electrical power distribution network.

It is well-known in the art to encode information transmitted over digital communication channels to enable the detection and/or correction of errors by the receiver. Various techniques are employed to add redundancy to a transmitted message. Parity-check codes are a type of code where the redundant information is derived from the message by performing summations or parity checks on the bits of the message. Errors in transmission can be detected by repeating these summations at the receiver, and comparing the results to the parity checks computed by the transmitter. If it is found that information has been corrupted or lost, some types of parity-check codes have decoding procedures that allow the receiver to correct errors introduced by the channel, or restore what has been lost. For this purpose, there are a number of parity check codes available each of which has certain advantages over other codes. Recent research has found that parity-check codes whose parity checks are relatively sparse—that is, each parity check bit is a sum of relatively few message bits—perform particularly well with iterative decoding methods. These codes are known as low-density parity-check or LDPC codes.

Unlike most parity-check codes, LDPC codes are described mainly by their parity-check or decoding matrices, rather than by their encoding matrices. Parity-check matrices derived from random constructions tend to perform quite well, but the resulting encoders tend to be expensive to implement. On the other hand, parity-check matrices with a definite structure result in simple encoders, but do not always have good decoding properties. Many of these structured codes have regular row and column weight (the number of 1s in every row or column of the parity-check matrix is identical), but recent research has demonstrated that codes with irregular row and column weight often leads to improved error correction capability. One type of structured LDPC code with a very simple encoder is a block-cyclic code where the parity-check matrix consists of blocks each of which have a cyclic structure. These codes often have regular row and column weight, but a recent article by S. Johnson and S. Weller, "A Family of Irregular LDPC Codes with Low Encoding Complexity," *IEEE Communications Letters,* vol. 7, pp. 79-81, Feb. 2003, demonstrates a way to construct block-cyclic LDPC codes with irregular column weight that outperform similar codes with regular column weight. However, their approach has a limited range in its allowable weight distribution, and does not allow for an irregular row weight.

Many power distribution systems now employ the TWACS® system to send and receive messages over electrical power lines to acquire information on the status of power users including current power usage. In an effort to improve the communications capability of a TWACS®, research has been done on LPDC error control codes. This research has shown that the encoders for typical randomly constructed LDPC codes exceed the storage and computation requirements of TWACS® transmitters.

The present invention is directed to a family of irregular LDPC codes having a pseudo-random structure and low encoding complexity. The family of codes described allows for both irregular column and irregular row weight and provides a broader range of weight distribution than the codes described by Johnson and Weller. In addition, the family allows block-cyclic LDPC codes to have a pseudo-random structure.

BRIEF SUMMARY OF THE INVENTION

The present invention is directed to a class of LDPC codes comprising a set of extensions to block-cyclic codes and provides for a much larger set of codes with irregular row or irregular column weighting together with greater control over row or column weight, and with parity-check matrices having a pseudo-random structure. These LDPC codes can be implemented with only a small increase in complexity over regular block-cyclic codes. Such codes are useful in the TWACS® system used to transmit and receive data over a power distribution system's electrical lines. In particular, the use of shortened, overlapping, or permuted blocks in a code's parity-check matrix allow for low-complexity encoding while achieving the improved performance of codes with irregular weight and pseudo-random structure.

Other objects and features will be in part apparent and in part pointed out hereinafter.

BRIEF DESCRIPTION OF THE SEVERAL VIEWS OF THE DRAWINGS

The objects of the invention are achieved as set forth in the illustrative embodiments shown in the drawings which form a part of the specification.

FIG. 4 is an illustration of a parity-check matrix;

FIG. 5 is an example of a Tanner graph;

FIG. 6 is a parity-check matrix for a (90, 60) code comprising three circulant blocks with column weights of 3, 4, and 5;

FIG. 7 is a parity-check matrix for a (70, 40) code comprising three circulant blocks with column weights of 3, 4, and 5 and in which two of the blocks have been shortened to produce irregular row weights;

Corresponding reference characters indicate corresponding parts throughout the several views of the drawings.

DETAILED DESCRIPTION OF INVENTION

The following detailed description illustrates the invention by way of example and not by way of limitation. This description will clearly enable one skilled in the art to make and use the invention, and describes several embodiments, adaptations, variations, alternatives and uses of the invention, including what I presently believe is the best mode of carrying out the invention. As various changes could be made in the above constructions without departing from the scope of the invention, it is intended that all matter contained in the above description or shown in the accompanying drawings shall be interpreted as illustrative and not in a limiting sense.

Figure 1:
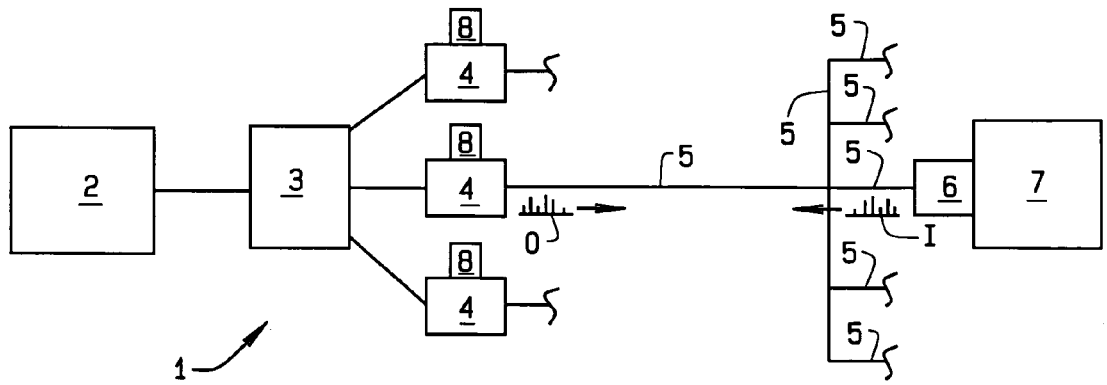
FIG. 1 is a simplified representation of an electrical distribution network including a two-way communications capability.
Figure 2:
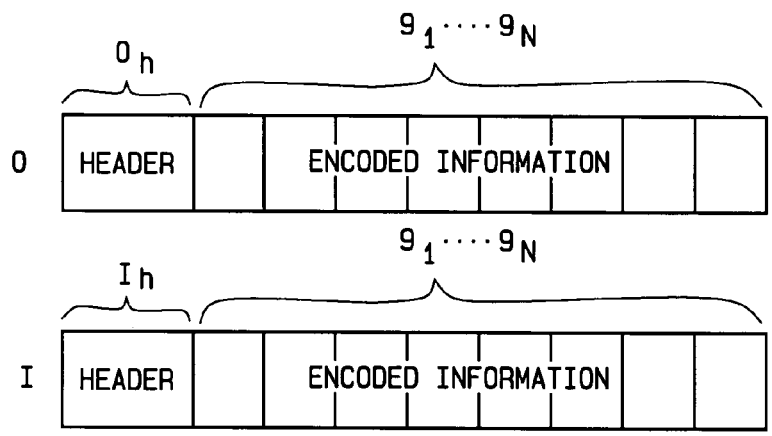
FIG. 2 is a representation of an outbound or inbound communications signal sent over the network.

Referring to FIG. 1, an electrical distribution system 1 includes a generator 2 for producing electrical energy. The energy is routed through various stations 3 and sub-stations 4 over power lines 5, and through electricity meters 6 into user facilities 7 such as homes, factories, office buildings, etc. Efficient operation of the system requires "real time" information as to current energy demand, possible overload conditions, outage occurrences, and related conditions. For this purpose, the TWACS® system includes a transmitter or transponder 8 located at a sub-station 4 or the like for generating and transmitting an encoded "outbound" message O to an end user location over the power lines 5. At the energy user location, the message is received and decoded by a transponder (not shown) incorporated in meter 6. In reply to the outbound message, a coded "inbound" message I is formulated and sent back by the transponder to the sub-station over the power lines. An example of an outbound and an inbound signal is shown in FIG. 2 as having a message header Oh or Ih which includes the address to which the message is being sent and related information, and a series of encoded message bits conveying the relevant information. As is known in the art, the message is divided into blocks $9_1$-$9_n$ of encoded data.

Power line communications are noisy. Random noise, EMI and RFI effects, non-linear power loads, and discontinuities or similar conditions can result in transmissions being corrupted. Messages transmitted using the TWACS® system often include information vital to the current performance of the system; and as such, it is important to be able to readily identify and correct corrupted or lost portions of a transmission. Accordingly, it is advantageous to employ a block-cyclic LDPC code having pseudo-random characteristics, which enables improved error correction relative to traditional coding techniques. Further, LDPC codes, which were first developed in the 1960s, have been more recently shown to perform near the theoretical limits for digital communications using iterative decoding techniques.

A number of factors must be considered in the design and implementation of a LDPC code. One is the desired bit error rate (BER); a second is the complexity of implementation of the code. The sparse nature of the parity check matrix used with a LDPC code makes the complexity of the decoding algorithm proportional to the message length. However, the associated encoding matrix for an arbitrary sparse parity-check matrix will have implementation complexity proportional to the square of the message length, which is too expensive for many applications. A recent approach to designing LDPC codes has been the use of algebraic and combinatorial constructions. These have been found to be particularly useful for high-rate codes with short block sizes because they avoid short cycles in the decoder that tend to reduce performance. Some of these LDPC codes, particularly those based on cyclic structures, also have the benefit of low encoding complexity. On the other hand, many of these combinatorially constructed codes have regular row and column weight, which is known to not perform as well as those having a more irregular structure. In the article mentioned earlier, Johnson and Weller have proposed a class of these codes that achieve irregular column weight and therefore improved performance.

The set of LPDC codes of the present invention, as described herein, comprise extensions to block-cyclic codes. The result is a much larger set of codes having irregular row or column weights, but also having greater control over the weighting. The codes incorporate parity check and encoding matrices having a pseudo-random structure. Importantly, this is achieved with only a small increase in complexity over regular block-cyclic codes.

Using standard notation from coding theory, an (N,K) code encodes K input bits into a message block 9 of length N by adding M=N−K redundant bits. The code is said to have a rate of K/N, representing the efficiency with which input bits are transmitted relative to the total number of transmitted bits. For parity-check codes, a parity check matrix H will have dimensions M×N, and a generator matrix G will have the dimensions K×N. For any given parity check matrix H, $G^T$ is defined as a basis for the null space of the matrix. If matrix H is defined as:

$$H = [A\ B] \qquad (1)$$

where A is a circulant matrix (meaning each column is a cyclic shift of the previous column) containing the first M columns and B is a circulant matrix containing the remaining columns of matrix H, then a systematic form of the matrix's null space $G^T$ can be constructed as follows:

$$G^T = \begin{bmatrix} A^{-1}B \\ I_K \end{bmatrix}. \qquad (2)$$

where $I_K$ is an identity matrix (meaning that it has ones on its diagonal and zeros elsewhere) of size K×K.

Figure 3:
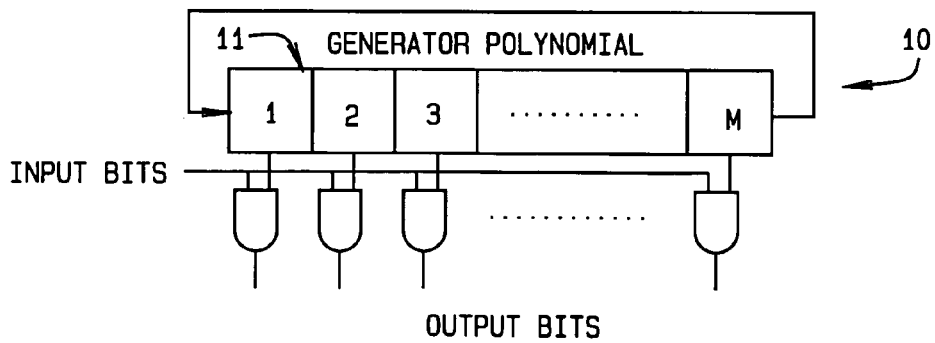
FIG. 3 is a simplified schematic of a block cyclic encoder.

The inverse of a circulant matrix is also circulant, as is the product of two circulant matrices. Accordingly, since A and B are both circulant matrices, then the matrix $A^{-1}B$ is also a circulant matrix. For a code where matrix B is circulant, or composed of multiple circulant matrices, and A is an invertible matrix, the generator matrix for the code also has a circulant structure. This allows the code to be implemented using a shift-register-based hardware implementation such as the encoder 10 shown in FIG. 3.

Use of a circulant structure imposes certain limitations. For example, a block-circulant matrix with an even weight will not be invertible using binary (modulo 2) arithmetic. Also, an odd-weight does not mean a circulant matrix will be invertible; although, in practice, most are. Therefore, a parity-check matrix with a block-circulant structure implies that at least one block of parity check H matrix must have an odd weight if generator matrix G is to have a block-circulant structure. This is important because LDPC codes of weight 4 are common.

An advantage of combinatorial LDPC code constructions is avoidance of short cycles in a Tanner graph. As is well-known to those skilled in the art, a Tanner graph is a bipartite graph an example of which is shown in FIG. 5 for a (7,4) Hamming code. The left portion of the graph comprises site nodes corresponding to symbol bits of the code, and the right portion of the graph comprises check nodes corresponding to parity checks in the graph. The four dashed lines in the chart indicate a cycle of length 4, where the information passed from one node to another in the message-passing decoder has reached its origination point after 2 iterations between message and check nodes. Short cycles like this inhibit decoding performance. For this reason, combinatorial designs have been used to allow the highest possible code rate for a given set of dimensions that is free of 4-cycles. The Johnson and Weller article referred to above discusses code constructions which are based on circulant matrices and which are free of 4-cycles. In addition, the codes employ a decoding matrix of irregular column weight, but a regular row weight.

The present invention is directed to a set of extensions to the structure of codes such as those described by Johnson and Weller to create LDPC codes having irregular row weight and an increased randomness in the overall code structure of the code, and having only a small increase in encoding complexity over those described in the Johnson and Weller article. The extensions are collectively described within the framework of generalized block-cyclic (GBC) codes.

A generalized block-cyclic code is defined as a code whose M×N parity check matrix H is expressed as:

$$H=[C\ P], \quad (3)$$

where C is a circulant matrix that is invertible under modulo 2 arithmetic and P is a sum of L component matrices. That is:

$$P = \sum_{l=1}^{L} P_l. \quad (4)$$

Each component matrix $P_l$ contains $C_l$ columns with non-zero elements, where $C_l \leq M$. Columns containing parity checks are taken from an M×M circulant matrix defined as:

$$P_l^{circ}=[P_{l,1}P_{l,2}\ldots P_{l,M}], \quad (5)$$

where the vector $P_{l,k}$ is created from vector $P_{l,j}$ by circularly shifting $P_{l,j}$ k−j times.

If $C_l=M$, $P_l$ is defined as:

$$P_l=\lfloor 0P_l^{circ}0 \rfloor \quad (6)$$

and the zero padding for each block is defined so that $$P = \sum_{l=1}^{L} P_l = [\ P_1^{circ}\ P_2^{circ}\ \ldots\ P_L^{circ}\ ]. \quad (7)$$

In the generalized version of this structure, it is assumed that $C_l \neq M$, and that each column vector P can appear in any arbitrary location in $P_l$. This will work so long as matrix P contains at least one vector $P_{l,j}$ in each column so that every column has a weight greater than zero.

Using the encoder structure from equation (2), the encoder for this parity-check matrix will be:

$$G^T = \begin{bmatrix} \sum_{l=1}^{L} C^{-1}P_L \\ I_k \end{bmatrix}. \quad (8)$$

For a data vector d of length N, the associated codeword c will be:

$$c = G^T d = \begin{bmatrix} \sum_{l=1}^{L} C^{-1}P_L d \\ d \end{bmatrix}. \quad (9)$$

A set of encoder blocks is now defined as: $E_l = C^{-1}P_l$. Each encoder block has the same cyclic structure as its associated decoder block. The parity-check portion of a codeword is generated as the sum of the outputs of each encoder block. An encoder 10 for this purpose is, as noted, shown in FIG. 3. At the beginning of an encoding operation, a shift register 11 portion of the encoder contains a vector $e_{l,1}=C^{-1}p_{l,1}$. For a traditional block code structure such as that defined in equation (7), the encoding involves "clocking-in" the relevant portion of a data vector d, and after each bit is clocked, circularly shifting the shift register. In accordance with the present invention, the columns of matrix $P_l$ can be in an arbitrary order, which is accomplished by allowing an arbitrary number of shifts of shift register 11 between input bits, and an arbitrary bit from data vector d being used at the input. While implementing this feature in hardware requires some additional control circuitry, the complexity of each of the encoders is still a linear function of N.

Beyond basic codes such as those defined by equation [1], the method of the present invention offers the following additional features:

1. Shortened Blocks. When $C_l=M$, the resulting code can have an irregular column weight, but will still have a regular row weight. However, by allowing $C_l<M$ an irregular row weight can be achieved as well.

2. Overlapped Blocks. Allowing arbitrary permutations of the columns of matrix $P_l$ allows some non-zero columns to coincide with non-zero columns of matrix $P_j$, creating columns with a different column weight. Generally, the weight is increased; but it can be reduced if a 1 appears at the same location in two of the matrices. However, as code size increases, the matrices $P_j$ become increasingly sparse, so for randomly chosen codes this becomes increasingly unlikely.

3. Arbitrarily Permuted Blocks. The fact that columns of a matrix $P_l$ can have columns of zeros between them, and that adjacent columns can have an arbitrary number of shifts, allows a single block to overlap with multiple other blocks, with the overlapping being somewhat irregular. If input bits are uncorrelated, using column permutations only to interleave blocks provides no benefit.

Shortening and overlapping blocks generally increases the number of blocks needed to insure all columns have a non-zero weight. To do this requires at least one additional cyclic block beyond that nominally required to generate a parity check matrix having the required dimensions. This will increase total encoding complexity, but the affect can be kept relatively small depending on how many additional blocks are used.

The effects of these three generalizations on code structure are illustrated in FIGS. 6-9. FIG. 6 illustrates a parity-check matrix for a (90,60) code, where the darkened blocks represent binary ones (1s) in the matrix. It will be understood that that binary zeroes (0s) are at all the other matrix locations. Further, the matrices shown in FIGS. 6-9 are illustrative only and do not necessarily represent optimum design with respect to cycle length, minimum distance, or other properties of interest to a code designer. The base code in FIG. 6 has blocks 9a-9c which are each 30 rows by 30 columns (30*30). The blocks 9a-9s have column weights of 3, 4, and 5 respectively. All the rows have a weight of 12.

Figure 8:
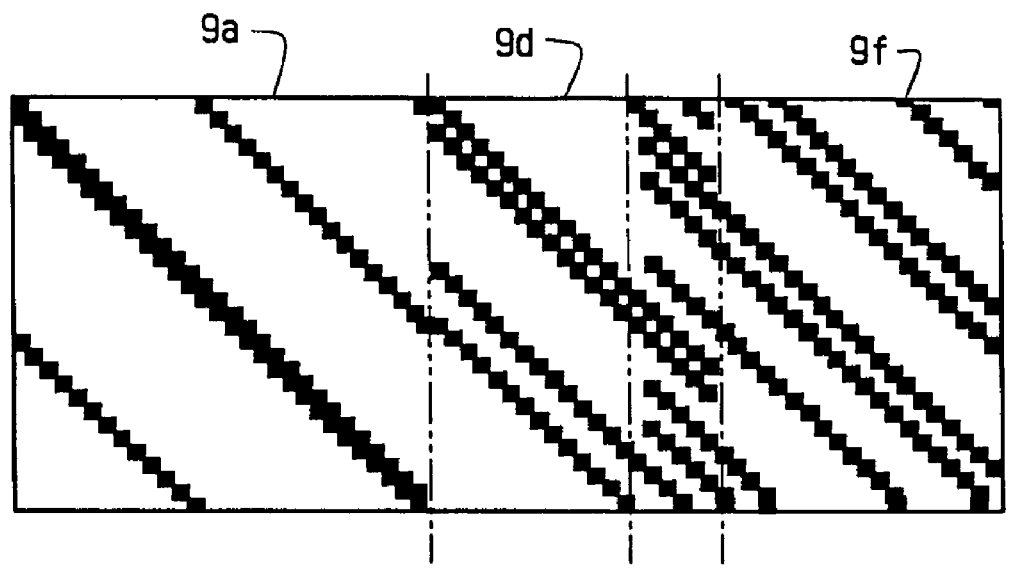
FIG. 8 is a parity-check matrix similar to that shown in FIG. 7, but in which two of the blocks have been shortened and overlapped; and, FIG. 9 is a parity-check matrix similar to that shown in FIG. 8, but in which one of the blocks has also been permuted so the overlap region has a pseudo-random code structure.
Figure 9:
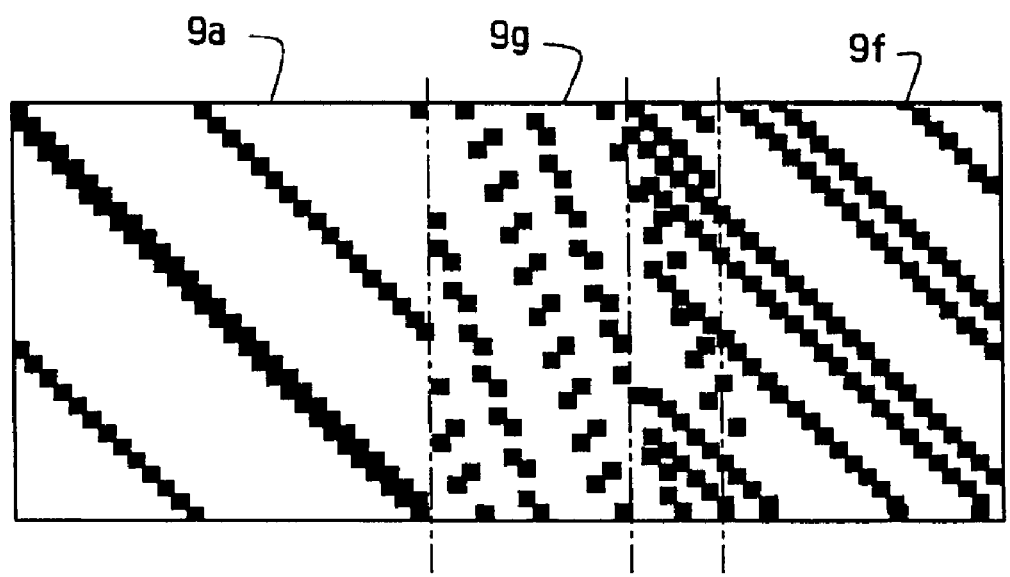

The matrices of FIGS. 7-9 use the three blocks of "base" code shown in FIG. 6 to create (80,60) codes that have different properties using the generalizations described above.

In FIG. 7, the left block 9a is still a 30*30 block. However, the other two blocks have been shortened to create blocks 9d and 9e each of which are 30*20 blocks. Using shortened blocks creates a code that still has column weights of 3, 4, and 5, but now has row weights ranging from 7 to 11.

In FIG. 8, left block 9a is still a 30*30 block. The middle block 9d is still a shortened block that is 30*20. Now, a right block 9f is a shortened block 30*25 in size. Further, the left five columns of block 9f are shifted to the left so to overlap the five right columns of block 9d. This is indicated by the dashed lines in FIG. 8. As result, the combined width of blocks 9d and 9f is forty columns, the same width as the blocks 9d and 9e in FIG. 7. However, overlapping the blocks 9d and 9f creates a new "virtual block" with a column weight 9, in addition to the column weights of 3-5. Because the blocks are also shortened, the row weights now range from 9-11.

FIG. 9 shows a simple example of arbitrarily permuted blocks. Here, left block 9a is still a 30*30 block, a middle block 9g is a shortened block that is 30*20, and right block 9f is a shortened block 30*25 in size with the left five columns of the block shifted to the left so to overlap the five right columns of middle block 9g. While the last two blocks 9g and 9f still overlap as before, the columns of middle block 9g are obtained by shifting the previous column in the block three times instead of only once. This is equivalent to clocking shift register 11 in FIG. 3 three times for each input bit. The result is column weights of 3, 4, 5, 7, and 9, row weights ranging from 8-12, and a pseudo-random structure of the code in the overlap region indicated by the dashed lines in FIG. 9. Those skilled in the art will note that this randomness can be increased by introducing more blocks and using non-uniform clocking patterns.

One consideration in the design of LDPC codes is the presence of short cycles in the Tanner graph of the decoder. See FIG. 5. The codes set out in the Johnson and Weller article, for example, use combinatorial constructions that guarantee the absence of 4-cycles. In accordance with my invention, it is possible, using only block shortening, to generate a code of the same dimensions that is still free of 4-cycles. For example, the (505, 404) code considered in their article can be shortened to create a (404, 303) code by shortening the last 4 blocks so that their total length is 303, rather than by just deleting the last block. Conversely, overlapping and randomly permuting columns from constituent blocks makes it easy to create 4-cycle codes. In general, codes containing 4-cycles are more difficult to avoid with shorter blocks and higher rates. While it is generally accepted that 4-cycle codes should be avoided because they degrade decoding performance, recent results have shown that some codes exist that are good, despite containing 4-cycles, because they have good minimum distance properties. See S. Lin, L. Chen, J. Xu, and I. Djurdjevic, "Near Shannon limit Block-cyclic Low-Density Parity-Check Codes," *Proceedings of the IEEE Global Telecommunications Conference* (GLOBECOM), vol. 4, pp. 2030-2035, Dec. 1-5 2003; and, H. Tang, J. Xu, S. Lin, and K. A. S. Abdel-Ghaffar, "Codes on Finite Geometries," *IEEE Transactions on Information Theory*, vol. 51, pp. 572-596, February 2005. Accordingly, while overlapping parity-check blocks can create problems due to short cycles, designs containing short cycles should not be completely ruled out.

With respect to the two-way communications system for power distribution networks, it will be appreciated that there are size and data capacity limitations inherent in the transponders installed at a meter. Use of the LDPC codes of the present invention enable an improvement in communication reliability while keeping the implementation costs within the design constraints imposed by the transponder.

In view of the above, it will be seen that the several objects and advantages of the present invention have been achieved and other advantageous results have been obtained.

Having thus described the invention, what is claimed and desired to be secured by Letters Patent is:

1. A method of generating an irregular LDPC (Low Density Parity check) code having a pseudo-random structure and low encoding complexity comprising:
    generating a set of sparse circulant matrices each of which is comprised of rows and columns containing ones and zeroes and with the sum of any column in a matrix being greater than one;
    permuting the order of the columns of any of the circulant matrices;
    concatenating the circulant matrices to create a single parity-check matrix; and,
    overlapping the columns of some of the circulant matrices so as to produce columns having a different column weight and structure than any component thereof as when considered individually, the resultant code being employed in a communications system to encode messages used to transmit and receive information.

2. The method of claim 1 in which the column order of any of the blocks is arbitrarily permuted.

3. The method of claim 2 in which component blocks have unequal column weight so as to allow the resulting LDPC code to have irregular column weight together with an overall randomness in the code structure.

4. The method of claim 3 in which the parity check matrix is formed by the concatenation of at least one additional cyclic block.

5. The method of claim 1 in which the columns of at least one component matrix are rearranged in a non-sequential order.

6. The method of claim 5 in which at least one component matrix has at least one column which coincides with at least one column of a second component matrix thereby to create a column of the LDPC parity-check matrix having a different column weight from either of the two component matrices.

7. The method of claim 6 in which the overlapping between blocks of code is irregular.

8. The method of claim 7 in which at least one component matrix is shortened in width so that it has fewer columns than rows.

9. The method of claim 8 further including increasing the number of component matrices.

10. The method of claim 1 in which each component matrix is a circulant matrix.

11. The method of claim 10 in which at least one component matrix is an invertible circulant matrix.

12. The LDPC code of claim 10 in which at least one of the circulant matrices is invertible.

13. An irregular low density parity check (LDPC) code employed in a communications system to encode messages used to transmit and receive information, the code having a pseudo-random structure and low encoding complexity, and the code comprising:
    data bits arranged in a sequence thereof and forming a plurality of blocks of the code, the data blocks overlapping so that any data bit can be part of more than one data block, and the data bits being permuted within each block so as to reorder their sequence during encoding; and, parity-check bits created by encoding each block of data bits using a cyclic block code having a weight greater than one and then summing the outputs of each of the resulting component blocks of code, so as to produce a new code whose structure is defined in part by the interactions between the component codes.

14. The LDPC code of claim 13 in which the code has a parity check matrix and an encoding matrix each of which has a pseudo-random structure so as to allow the LDPC code to have the performance capabilities of randomly generated codes.

15. The LDPC code of claim 14 in which the parity check matrix is formed by adding at least one additional cyclic block to the code.

16. The LDPC code of claim 13 in which the order of the data bits within each block is arbitrarily permuted.

17. The LDPC code of claim 13 in which each component block code is described by a matrix, the columns of at least one matrix are arranged in a non-sequential order, and the column weights of the different matrices differ from each other.

18. The LDPC code of claim 17 in which one of the matrices has at least one non-zero column which coincides with at least one non-zero column of a second matrix thereby to create a column having a different column weight.

19. The LDPC code of claim 18 in which the overlapping between blocks of code is irregular.

20. The LDPC code of claim 19 in which at least one component block code is also shortened, such that the number of input bits is fewer than the number of output bits.

21. The LDPC code of claim 20 further including increasing the number of component block codes.

22. The LDPC code of claim 13 in which each component block code can be described by a circulant matrix.

23. The LDPC code of claim 13 used in generating messages sent and received over electrical power lines in a power distribution system to acquire information about operations of the power distribution system.

* * * * *